(12) United States Patent
Chen et al.

(10) Patent No.: US 8,709,682 B2
(45) Date of Patent: Apr. 29, 2014

(54) MASK AND METHOD FOR FORMING THE MASK

(75) Inventors: Chia-Jen Chen, Jhudong Township, Hsinchu County (TW); Anthony Yen, Zhubei (TW); Hsin-Chang Lee, Hsin-Chu Xian (TW); Sheng-Chi Chin, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 53 days.

(21) Appl. No.: 13/369,061

(22) Filed: Feb. 8, 2012

(65) Prior Publication Data

US 2013/0202992 A1 Aug. 8, 2013

(51) Int. Cl.
*G03F 1/26* (2012.01)

(52) U.S. Cl.
USPC .............................. 430/5; 382/144

(58) Field of Classification Search
USPC .............................. 430/5; 382/144
See application file for complete search history.

(56) References Cited

U.S. PATENT DOCUMENTS

| 5,795,685 | A * | 8/1998 | Liebmann et al. ............. 430/5 |
| 6,235,434 | B1 * | 5/2001 | Sweeney et al. ............... 430/5 |
| 2007/0188743 | A1 * | 8/2007 | Tanaka et al. ............. 356/237.1 |
| 2013/0017475 | A1 * | 1/2013 | Terasawa et al. ............ 430/5 |

* cited by examiner

*Primary Examiner* — Christopher Young
(74) *Attorney, Agent, or Firm* — Haynes and Boone, LLP

(57) ABSTRACT

Provided is a method for reducing phase defects on many different types of semiconductor mask blanks. The method includes receiving a semiconductor mask blank substrate, creating alignment marks on the surface of the substrate, performing an inspection of the surface of the substrate to locate a plurality of surface defects, and repairing the plurality of surface defects on the surface of the substrate. A semiconductor mask is also provided that includes a repaired substrate a multilayer stack comprising a plurality of molybdenum and silicon layers, a capping layer, an absorber layer, and in some instances a photoresist layer.

20 Claims, 3 Drawing Sheets

MASK AND METHOD FOR FORMING THE MASK

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Semiconductor fabrication relies heavily on the process of photolithography, in which light of a given frequency is used to transfer a desired pattern onto a wafer undergoing semiconductor processing. To transfer the pattern onto the wafer, a photomask (also referred to as a mask or reticle) is often used. The photomask permits and prevents light in a desired pattern onto a layer of the wafer, such as a photoresist (PR) layer, which chemically reacts to the light exposure, removing some portions of the PR and leaving other portions. The remaining PR is then used to pattern an underlying layer. As feature sizes have decreased, the wavelength of light used in photolithography to pattern layers has decreased as well, creating additional difficulties and necessitating technological advances such as the use of extreme ultraviolet (EUV) as a light source, phase-shifting masks, and other advances. Improving photomasks is important to the continued advances in the industry, because various kinds of photomask defects can result in compounding defects in the patterned layers. Photomask improvements include improves made in substrate material and quality, such as the use of low thermal expansion material (LTEM) substrates for EUV masks.

For example, during photomask fabrication, attempts are often made to clean the photomask substrate before additional layers are applied. The processes used to clean and polish the photomask substrate have improved. However, defects are often introduced during and may remain after the cleaning and polishing. Therefore, there is a continuing need for systems and techniques to improve the characteristics of mask substrates.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

Figure 1:
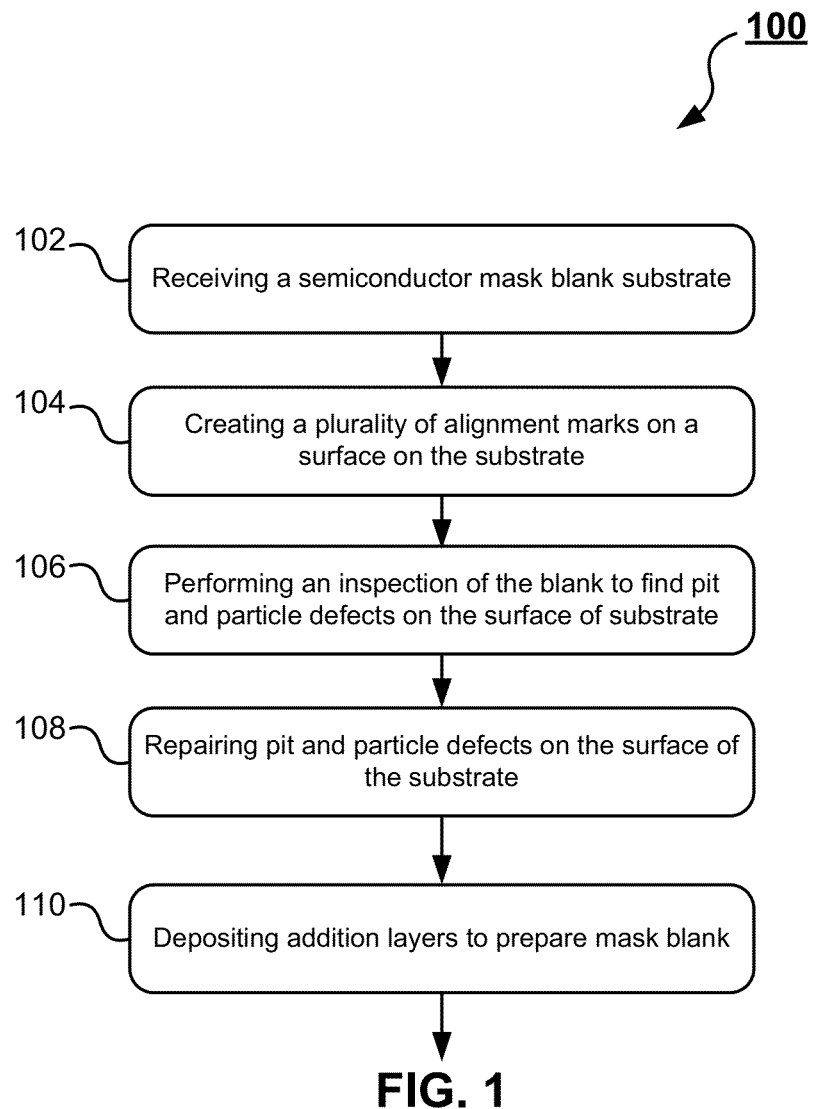
FIG. 1 is a flowchart depicting a method for removing defects from a semiconductor mask blank substrate.

The various features disclosed in the drawings briefly described above will become more apparent to one of skill in the art upon reading the detailed description below.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

FIG. 1 illustrates a method 100 for preparing photomask substrates according to various aspects of the present disclosure. The method 100 begins with step 102 by receiving a photomask substrate in a photomask processing system. The system may include many different tools or machines capable of many different kinds of processes, such as material deposition, material removal, and physical characterization. The photomask substrate may be of a variety of suitable materials, including quartz, glass, low thermal expansion materials (LTEMs), and other materials that may be apparent to those skilled in the art. The substrate may be particularly suitable for extreme ultraviolet (EUV) masks, opaque MoSi on glass masks (OMOG), or phase-shifting masks (PSMs).

After the photomask substrate has been received, the method 100 continues in step 104 by creating a plurality of alignment marks on the surface of the substrate. The plurality of alignment marks may be made in a variety of ways. The alignment marks may comprise bumps or depressions made on the surface. If the alignment marks comprise bumps, the bumps are formed by depositing material, such as chromium or silicon oxide, on the surface by a localized deposition process. Such processes include gas-assisted deposition (GAD), such as electron beam (e-beam) deposition, focused ion beam (FIB) deposition, or laser beam deposition with a chromium gas, TEOS, or other gas suitable for a GAD process.

If the alignment marks are depressions, they are made by a localized material removal process. Suitable removal processes include physical removal processes like laser ablation, such as by a pulsed laser, or gas-assisted etching (GAE) with an e-beam, FIB, or laser tool. A chemical etch process may also be adequate to form the alignment marks.

The bump or depression created for the alignment marks may be created in many different shapes. For example, the alignments marks are roughly circular or roughly square. The bumps or depressions are used to provide a localized coordinate system on the wafer for subsequent steps in method 100. The bumps or depressions can range from 2 to 20 microns in diameter. In one embodiment, a depression created as an alignment mark by pulsed laser ablation is 3 microns in diameter and 0.5 microns deep. Two or more alignment marks may be created for use in an subsequent process steps.

In step 106, an inspection of the blank is performed in order to locate defects on the surface that may be repairable. In performing the inspection, the alignment marks are used to create a localized coordinate system that can be used to catalog the location of individual defects. The inspection may be a visual inspection using optical microscopy to identify defects. The defects on the surface can include pit defects and bump or particle defects. For example, during CMP processes that are normally used to create a level surface on the substrate, some pits that were present before the CMP processes are not thoroughly removed. Thus, small pits remain after CMP. Additionally, small pits can be formed during polishing. Also, pieces of foreign material or detached pieces of the substrate can remain on top of the substrate even after a typical cleaning process, leaving particle defects.

Thus, in step 106, a catalog of the defects are made while performing the inspection. The catalog may include the coordinates and types (whether pit or particle for example) of a plurality of defects detected on the surface of the substrate. This inspection and cataloging process may be entirely or partially automated, so that a computer system detects the defects and catalogs their coordinates for later repair.

The method continues in step 108 by undertaking to repair the cataloged pit and particle defects. A variety of tools may be used in order to repair the pit and particle defects. When a pit defect is repaired, one of several deposition processes are used. These deposition processes may be localized deposition processes such as gas-assisted e-beam, FIB, or laser deposition. In some embodiments, the pits are filled with deposited chromium, or other such material that can be controllably, locally deposited to fill the pit defect to make it level with the rest of the surface of the substrate. The process of local deposition can potentially result in an excess of material being deposited at the site of the pit defect. When that occurs, the level of the surface at the location of the pit is above the normal surface level of the surrounding substrate.

In such an instance, some of the excess material deposited while repairing the pit may be removed. Removal may be done by a localized material removal process. Such processes are similar to those previously described for creating the depression-type alignment marks. Further, the excess material may also be removed by the use of atomic force microscopy (AFM) nanomachining. In an AFM nanomachining process, the AFM tip is used as a machining tool rather than, or in addition to, a metrology tool. Thus, AFM nanomachining may be used to decrease the level of deposited material down to match the surrounding surface level.

In some embodiments of the invention, the repair tool or repair system have a field of operation that is limited to an area smaller that the entire substrate surface. In such an instance, using more than two marks is beneficial to supply localized coordinates for each limited field of operation required to repair the entire substrate. The alignment marks are often located outside the field of operation.

In some instances it is desirable to remove material from the pit defect before depositing material to fill the pit. In such instances, in preparation for depositing material, the pit is further enlarged by localized etching techniques. The pit enlargement may be accomplished through the use of laser ablation, e-beam, or FIB etching, gas-assisted etching (GAE), or other suitable method. Once the pit has been adequately enlarged, it is repaired as in the preceding paragraph.

When a particle defect is being removed, a localized etch process is used such as those mentioned above. Additionally, AFM nanomachining may be used to remove the material that exceeds the surface level, thereby removing the particle defect.

Following the particle defect removal, as well as the excess material removal process during a pit defect repair, a cleaning or purging process is used to remove residue that may be left behind after repair. The cleaning process is a dry cleaning process such as a $CO_2$ dry cleaning process. This may remove the small portions of material that are generated during nanomachining.

The activities undertaken in step 108 to repair the pit and particle defects may be entirely or partially automated. Thus, in some embodiments, a repair system receives the cataloged locations and types of defects and automatically undertakes the necessary repairs. For example, the system begins by filling all pit defects, and then continues by nanomachining or etching all particle defects. Or, the system repairs all defects located within a given area of the substrate before moving on to another area of the substrate. This is done with little involvement of a human operator. Alternatively, a human operator receives the coordinates and types of defects from the inspection tool and uses the repair system, along with the coordinates and defect types to direct and control appropriate repair processes to reduce defects on the substrate.

FIGS. 2A-F depict a series of diagrammatic fragmentary cross-sectional side views of a portion of a mask substrate 200 in a process for removing defects from the surface of the substrate. The process is similar to that depicted in the flowchart of FIG. 1. For clarity of explanation, the description of FIGS. 2A-F will treat the mask substrate as a substrate suitable for an EUV mask. However, the embodiments of the invention may include more than just EUV masks.

Figure 2A:
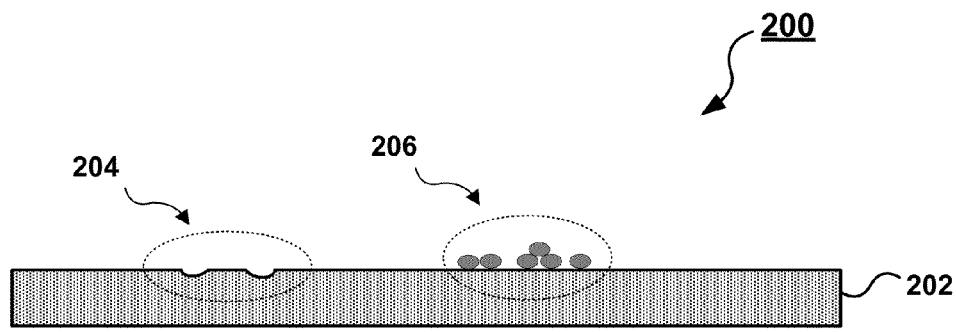
FIGS. 2A-F depict a series of diagrammatic fragmentary cross-sectional side views of a portion of semiconductor mask blank substrate in a process for removing defects from the surface of the substrate.

FIG. 2A depicts a mask substrate 202. The mask substrate 202 is a low thermal expansion material (LTEM) substrate suitable for an EUV mask. The mask substrate 202 may have already gone through a typical polishing and cleaning process in preparation for a subsequent mask formation process. A significant number of defects may have already been removed by the polishing and cleaning process. However, as depicted in FIG. 2A, the mask substrate 202 still includes a plurality of pit defects 204 and a plurality of particle defects 206 on its surface. Due to increasing lithography demands, an EUV mask made from the substrate 202 as depicted in FIG. 2A will produce many unwanted phase defects. Thus, the mask substrate 202 will undergo a surface repair process to reduce potential phase defects.

Figure 2B:
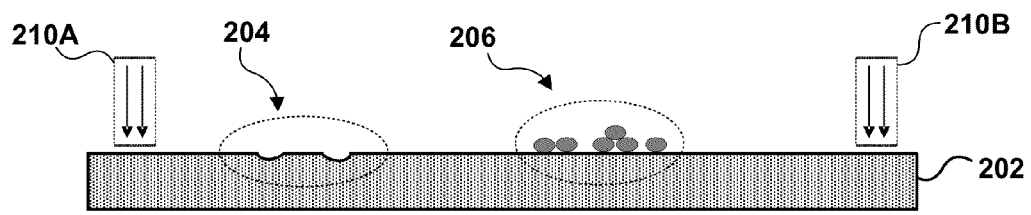

In FIG. 2B, the substrate 202 may undergo an alignment mark formation process 210, which includes localized alignment mark formation processes 210A and 210B. In certain embodiments, the alignment mark process processes 210A and 210B are pulsed laser ablation processes. Alternatively, the localized alignment mark processes 210A and 210*b* may be processes that deposit material on the surface of the substrate 202 or other processes, like laser ablation, that remove material from substrate 202. If the processes 210A and 210B are deposition processes, potential deposition processes include GAD processes. If the processes 210A and 210B are material removal processes, the removal processes include ablation or gas-assisted etching techniques.

Figure 2C:
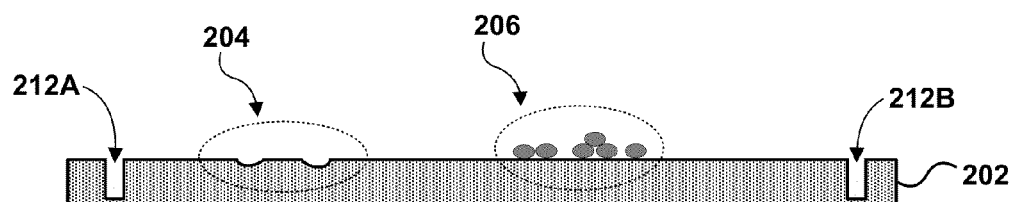

FIG. 2C depicts the result of the alignment mark processes 210A and 210B. The surface of the substrate 202 may include alignment marks 212A and 212B. The alignment marks 212A and 212B may be cavities or depressions created by pulsed laser ablation. The alignment marks 212A and 212B are used in process steps that rely on coordinates to find the plurality of pit defects and the plurality of particle defects. In at least one embodiment, the alignment marks 212A and 212B are generally square in shape, and about 3 microns on the sides and 0.5 microns deep.

After the alignment marks 212A and 212B (and other alignment marks which may have been made but which are not depicted) have been formed, a visual inspection of the surface of the substrate 202 is performed. As part of the visual inspection process, the alignment marks 212A and 212B serve as a coordinate system so that the locations of surface defects such as pit defects 204 and particle defects 206 can be cataloged. The cataloged locations are used as shown in FIGS. 2D and 2E.

Figure 2D:
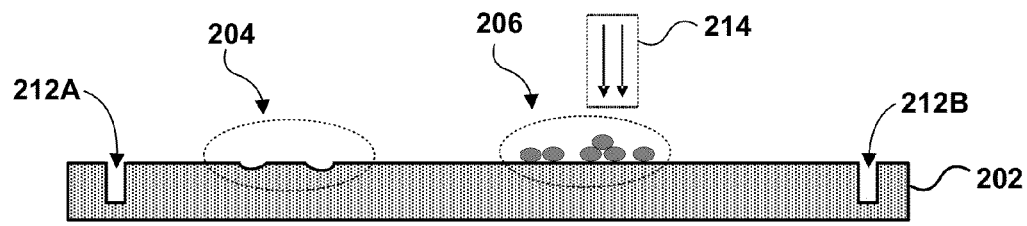

FIG. 2D depicts the removal of the particle defects 206 by a removal process 214. The location of the particle defects 206 is obtained during the inspection process performed earlier. The removal process 214 may be AFM nanomachining process. In such an embodiment, the AFM tip is used to break apart the individual particles of the plurality of particle defects 206 so that they can be cleared away later in a dry cleaning process.

Figure 2E:
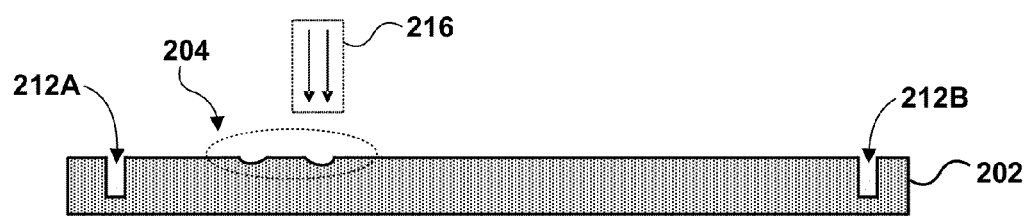

FIG. 2E shows the particle defects 206 as removed by the removal process 214. FIG. 2E also shows a plurality of pit defects 204 undergoing a filling process 216. The filling process 206 depicted is a localized deposition process. For example, the plurality of pit defects 204 are filled with chromium by an e-beam deposition process. After the filling process 216 is completed, there may be an access of material at the filled location, such that the height in the filled location exceeds the level of the surrounding substrate surface. In some embodiments the amount of material deposited into one of pit defects 204 by the filling process 216 exceeds a volume defined by the one of the pit defects 204, thus create a bulge of excess material. A removal process similar to the removal process 214 depicted in FIG. 2D, such as AFM nanomachining, is used to remove excess material. After this removal process, the level of the substrate is substantially flat. The repaired substrate 202 may undergo a $CO_2$ dry cleaning process or other cleaning process to remove remaining residue.

Figure 2F:

FIG. 2F depicts the repaired substrate 202. The alignment marks 212A and 212B remain on the surface of the substrate 202. Alternatively, some or all of the alignment marks made to facilitate surface defect removal, including the alignment marks 212A and 212B, are removed by processes similar to those described above in connection with pit defect repair.

In an embodiment of the invention comprising an EUV mask blank, several layers are deposited after the substrate has been cleaned as in FIG. 2F. For example, a multilayer (ML) stack of alternating layers of high index of refraction material and low index of refraction material. The alternating layers are alternating layers of molybdenum and silicon. After the ML stack, a capping layer is deposited. The capping layer is ruthenium capping layer. Following the capping layer, an absorber layer is deposited, which may in turn be followed by an anti-reflective coating (ARC) layer and a photoresist (PR) layer.

Embodiments of the invention include a method for decreasing phase defects on a semiconductor mask blank. The method includes steps of receiving a semiconductor mask blank substrate, creating alignment marks on the surface of the substrate, inspecting the surface of the substrate to locate a plurality of surface defects, and repairing the plurality of surface defects on the surface of the substrate. In some embodiments, creating alignment marks on the surface of the substrate is performed by creating depressions on the surface of the substrate. A laser punch is used to create the depressions on the surface of the substrate. In other embodiments, creating alignment marks on the surface of the substrate is accomplished by depositing material to create a bump on the surface.

In at least some of the embodiments, a method for decreasing phase defects on a semiconductor mask blank includes logging the location of each of the plurality of surface defect during the inspection of the surface of the substrate. The plurality of surface defects comprises pit defects and/or particle defects. Repairing the particle defects is performed using at least one of an electron beam, a focused ion beam, a laser beam, or AFM nanomachining to remove at least one of the particle defects from the surface of the substrate. And repairing the pit defects comprises locally depositing material into at least one of the pit defects. The deposited material deposited is chromium, in at least one embodiment.

In a particular embodiment, repairing the pit defects comprises enlarging some or all of the pit defects before depositing material to fill some or all or the pit defects. Locally depositing material into at least one of the pit defects comprises depositing an excess of material into the pit defect. In some embodiments this may create a bulge of the deposited material on the surface of the substrate which is then removed by using an electron beam, focused ion beam, laser beam, or AFM nanomachining process. To prepare the substrate surface, at least some methods further comprise subjecting the substrate to a dry cleaning process, like a $CO_2$ dry cleaning process, to remove residue resulting from the removal of the excess material bulge.

In yet another embodiment, a method for producing a semiconductor mask blank with few phase defects is provided. The method comprises receiving a semiconductor mask blank substrate, creating alignment marks on the surface of the substrate, and performing an inspection of the surface of the substrate to locate and catalog a plurality of surface defects. The method further comprises repairing the plurality of surface defects on the surface of the substrate and depositing a plurality of alternating layers of high index of refraction and low index of refraction materials.

Some embodiments further include depositing a capping layer on top of the plurality of alternating layers, depositing an anti-reflective coating on top of the capping layer, and depositing a photoresist layer over the anti-reflective coating.

Additional embodiments include a semiconductor mask blank. The blank comprises a repaired substrate, a multilayer stack comprising a plurality of molybdenum and silicon layers, a capping layer, an absorber layer, and a photoresist layer. In at least some embodiments, the repaired substrate has a pit defect that has been repaired by deposition localized to an area of the pit defect or a particle defect that has been repaired by nanomachining localized to an area of the particle defect. In some embodiments, the repaired substrate includes both a pit defect that has been repaired by deposition localized to an area of the pit defect and a particle defect that has been repaired by nanomachining localized to an area of the particle defect.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for decreasing phase defects on a surface of a mask blank substrate, the method comprising:
    receiving the mask blank substrate;
    creating two or more alignment marks on a surface of the mask blank substrate;
    performing an inspection of the surface of the mask blank substrate to locate a plurality of surface defects; and
    repairing the plurality of surface defects on the surface of the substrate.

2. The method of claim 1, wherein creating two or more alignment marks on the surface of the substrate further comprises creating two or more depressions on the surface of the substrate.

3. The method of claim 2, wherein creating two or more depressions on the surface of the substrate comprises using a laser punch to create the depressions on the surface of the substrate.

4. The method of claim 1, wherein creating two or more alignment marks on the surface of the substrate further comprises depositing material to create two or more bumps on the surface.

5. The method of claim 4, further comprising logging the location of each of the plurality of surface defects during the inspection of the surface of the substrate.

6. The method of claim 5, wherein the plurality of surface defects comprises pit defects and particle defects.

7. The method of claim 6, wherein repairing the particle defects comprises using at least one of an electron beam, a focused ion beam, a laser beam, or an atomic force microscopy (AFM) nanomachining process to remove at least one of the particle defects from the surface of the substrate.

8. The method of claim 6, wherein repairing the plurality of surface defects comprises locally depositing material into at least one of the pit defects.

9. The method of claim 8, wherein the material deposited into at least one of the pit defects comprises chromium.

10. The method of claim 8, further comprising enlarging the at least one of the pit defects before depositing material into the at least one of the pit defects.

11. The method of claim 8, wherein:
locally depositing material into the at least one of the pit defects comprises depositing an excess of material into the at least one of the pit defects such that a volume of the material exceeds a volume defined by the at least one of the pit defects, thereby forming a bulge on the surface of the substrate; and
removing the bulge formed by the excess of material by using at least one of an electron beam, a focused ion beam, a laser beam, or an AFM nanomachining process.

12. The method of claim 11, further comprising subjecting the substrate to a dry cleaning process to remove residue associated with the removing the bulge formed by the excess of material.

13. The method of claim 12, wherein subjecting the substrate to a dry cleaning process comprises subjecting the substrate to a $CO_2$ dry cleaning process.

14. A method for producing a mask blank, the method comprising:
receiving a mask blank substrate;
creating a plurality of alignment marks on a surface of the mask blank substrate;
performing an inspection of the surface of the mask blank substrate to locate and catalog a plurality of surface defects;
repairing the plurality of surface defects on the surface of the substrate; and
depositing a plurality of alternating layers of high index of refraction and low index of refraction materials on the inspected surface of the mask blank substrate.

15. The method of claim 14, further comprising:
depositing a capping layer above the plurality of alternating layers; and
depositing an anti-reflective coating above the capping layer.

16. The method of claim 15, further comprising a photo resist layer over the anti-reflective coating.

17. A semiconductor mask, the mask comprising:
a repaired substrate;
a multilayer stack comprising a plurality of alternating high and low index of refraction materials above the repaired substrate;
a capping layer above the multilayer stack; and
an absorber layer above the multilayer stack.

18. The semiconductor mask of claim 17, wherein the repaired substrate comprises a pit defect that has been repaired by deposition localized to an area of the pit defect.

19. The semiconductor mask of claim 17, wherein the repaired substrate comprises a particle defect that has been repaired by nanomachining localized to an area of the particle defect.

20. The semiconductor mask of claim 17, wherein the repaired substrate comprises:
a pit defect that has been repaired by deposition localized to an area of the pit defect;
a particle defect that has been repaired by nanomachining localized to an area of the particle defect.

* * * * *